(12) United States Patent
Funakawa

(10) Patent No.: US 10,798,259 B2
(45) Date of Patent: Oct. 6, 2020

(54) INPUT DEVICE AND IMAGE FORMING APPARATUS

(71) Applicant: Konica Minolta, Inc., Tokyo (JP)

(72) Inventor: Hisataka Funakawa, Hachioji (JP)

(73) Assignee: Konica Minolta, Inc., Tokyo (JP)

( * ) Notice: Subject to any disclaimer, the term of this patent is extended or adjusted under 35 U.S.C. 154(b) by 0 days.

(21) Appl. No.: 16/511,530

(22) Filed: Jul. 15, 2019

(65) Prior Publication Data
US 2020/0099801 A1 Mar. 26, 2020

(30) Foreign Application Priority Data

Sep. 21, 2018 (JP) ................................. 2018-177790

(51) Int. Cl.
| | | |
|---|---|---|
| *H04N 1/00* | (2006.01) | |
| *G06F 3/041* | (2006.01) | |
| *G06F 3/0488* | (2013.01) | |
| *H03K 17/96* | (2006.01) | |

(52) U.S. Cl.
CPC ....... *H04N 1/00411* (2013.01); *G06F 3/0414* (2013.01); *H03K 17/962* (2013.01); *H04N 1/00384* (2013.01)

(58) Field of Classification Search
None
See application file for complete search history.

(56) References Cited

U.S. PATENT DOCUMENTS

| | | | | |
|---|---|---|---|---|
| 9,436,285 | B2* | 9/2016 | Shirai | G06F 3/016 |
| 2002/0149561 | A1* | 10/2002 | Fukumoto | G01C 21/3664 |
| | | | | 345/156 |
| 2009/0051509 | A1* | 2/2009 | Hwang | H04B 1/3888 |
| | | | | 340/407.2 |
| 2009/0147973 | A1* | 6/2009 | Gitzinger | H04R 17/00 |
| | | | | 381/190 |
| 2010/0238116 | A1* | 9/2010 | Shin | G06F 3/016 |
| | | | | 345/168 |
| 2013/0335211 | A1* | 12/2013 | Kobayashi | G06F 1/1626 |
| | | | | 340/407.2 |
| 2014/0265651 | A1* | 9/2014 | Kim | H02K 33/16 |
| | | | | 310/25 |
| 2015/0054756 | A1* | 2/2015 | Ikeda | G06F 3/016 |
| | | | | 345/173 |
| 2015/0076931 | A1* | 3/2015 | Akasaka | B06B 1/04 |
| | | | | 310/19 |
| 2015/0116770 | A1* | 4/2015 | Tanaka | G06F 3/04847 |
| | | | | 358/1.15 |
| 2015/0138387 | A1* | 5/2015 | Kokubu | G06F 3/04886 |
| | | | | 348/222.1 |

(Continued)

FOREIGN PATENT DOCUMENTS

JP          5658493 B2     1/2015

*Primary Examiner* — Beniyam Menberu
(74) *Attorney, Agent, or Firm* — Osha Liang LLP

(57) ABSTRACT

An input device includes: an operation panel that receives an operation input; a vibration element that is mounted to the operation panel and that vibrates the operation panel in at least one vibration direction; a vibration absorber that connects the operation panel to an apparatus main body and that absorbs a vibration of the operation panel; and a CPU that causes the vibration element to vibrate based on the operation input, wherein the vibration element is mounted on a gravity center axis of the operation panel in the vibration direction.

5 Claims, 14 Drawing Sheets

(56) References Cited

U.S. PATENT DOCUMENTS

| | | | |
|---|---|---|---|
| 2015/0256656 A1* | 9/2015 | Horii | H04M 1/03 455/575.1 |
| 2016/0373597 A1* | 12/2016 | An | H04N 1/00411 |
| 2017/0045991 A1* | 2/2017 | Watanabe | H04N 1/00411 |
| 2017/0171406 A1* | 6/2017 | Yamamoto | G06F 3/016 |
| 2017/0208195 A1* | 7/2017 | Yamamoto | G06F 1/1632 |
| 2019/0297176 A1* | 9/2019 | Lee | H04M 1/0262 |

* cited by examiner

INPUT DEVICE AND IMAGE FORMING APPARATUS

CROSS-REFERENCE TO RELATED APPLICATION

The entire disclosure of Japanese Patent Application No. 2018-177790, filed on Sep. 21, 2018, is incorporated herein by reference.

BACKGROUND

Technical Field

The present invention relates to an input device and an image forming apparatus. More specifically, the present invention relates to a technology for vibrating part of an operation unit and the like of the apparatus.

Description of the Related Art

Conventionally, various portable terminals, such as smartphones, performing notification by vibration, as the response of operation on touch panels and the like have been in practical use. That is, a vibration element called a vibrator is incorporated in the portable terminal, and vibrates the portable terminal for a previously set time as the response at the time of detecting touch on the touch panel, thereby performing the response of operation by vibration with respect to a user holding the portable terminal.

In the case of the portable terminal, such as the smartphone, since the user holds the portable terminal during operation, the vibration by the vibration element is directly transmitted to his/her hand. Therefore, in the portion vibrated by the vibration element, the vibration is uniformly transmitted to the hand holding the portable terminal, regardless of the depressed position on the touch panel, and typically, the back surface of the terminal is strongly vibrated.

Patent Literature 1 (U.S. Pat. No. 5,658,493) describes a tactile sense presentation device including a touch panel, its technology changing the tactile sense presented according to the position where a user touches the panel, thereby presenting the tactile sense in a plurality of stages to the user.

CITATION LIST

Patent Literature

Patent Literature 1: U.S. Pat. No. 5,658,493

By the way, a stationary apparatus, such as a digital multifunction apparatus, equipped with a touch panel has been widely used in recent years, and also in such a stationary apparatus, it has been proposed that the response of operation is performed with respect to a user by a vibration member at the time of touching the touch panel.

However, the stationary apparatus, such as the digital multifunction apparatus, is different in the way of vibration transmission from the portable terminal that transmits the vibration to a hand holding the terminal, and vibrates only a finger that has touched the touch panel, so that it is difficult to perform the response by the vibration at a uniform strength.

That is, when the touch panel itself is vibrated to perform the response by the vibration with respect to the user who has performed the touch operation, unless the vibration is uniformly transmitted to the finger that has touched the panel, the state where the vibration is difficult to be transmitted to the finger is caused according to the vibration state. However, when any portion, such as the center and periphery of the touch panel, is touched, it is very difficult to uniformly give the vibration.

Also, in the stationary apparatus, such as the digital multifunction apparatus, various components are disposed in the apparatus at high density, and there is also the case where the vibration element cannot be always disposed on the optimum position in vibrating the touch panel. In such a case, the vibration state of the touch panel is further non-uniform.

Here, as described in Patent Literature 1, it has been proposed that the tactile sense by the vibration is actively changed according to the position where the user touches the panel. However, on the touch panel disposed in the stationary apparatus, even when in the first place, the touch panel is attempted to be uniformly vibrated, the vibration given to the finger and the like that have touched the panel is non-uniform according to the touch position, as described above, so that it is difficult to control the vibration state into the proper state.

SUMMARY

One or more embodiments of the present invention provide an input device and an image forming apparatus that can present response by uniform vibration with respect to a user when any position on an operation panel is touch operated.

An input device reflecting one aspect of the present invention comprises an operation panel receiving an operation input by a user, a vibration element mounted with respect to the operation panel and vibrating the operation panel in at least one direction, a vibration absorption member connecting the operation panel to an apparatus main body and absorbing the vibration of the operation panel, and a vibration control unit executing the vibration by the vibration element according to the state of receiving the operation input on the operation panel.

And, the vibration element is disposed near on a gravity center axis in the vibration direction that vibrates the operation panel.

An image forming apparatus reflecting one aspect of the present invention comprises an image forming unit performing an image forming process on a printing medium, an operation panel receiving an operation input associated with the image forming process by a user, a vibration element mounted with respect to the operation panel and vibrating the operation panel in at least one direction, a vibration absorption member connecting the operation panel to an apparatus main body side and absorbing the vibration of the operation panel, and a vibration control unit executing the vibration by the vibration element according to the state of receiving the operation input on the operation panel.

And, the vibration element is disposed near on a gravity center axis in the vibration direction that vibrates the operation panel.

BRIEF DESCRIPTION OF THE DRAWINGS

The advantages and features provided by embodiments of the invention will become more fully understood from the detailed description given hereinbelow and the appended drawings which are given by way of illustration only, and thus are not intended as a definition of the limits of the present invention.

DETAILED DESCRIPTION

Figure 1:
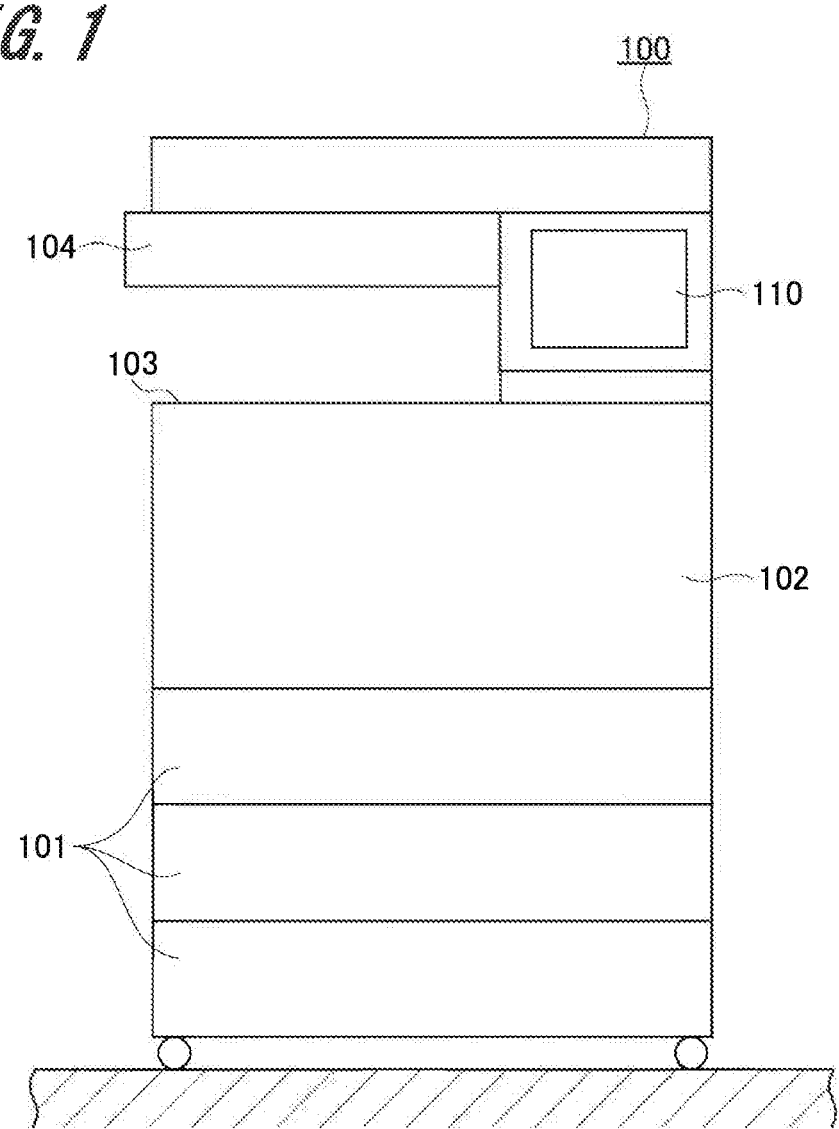
FIG. 1 is a block diagram illustrating an example of an image forming apparatus according to one or more embodiments of the present invention.

Hereinafter, embodiments of the present invention will be successively described with reference to the drawings. However, the scope of the invention is not limited to the disclosed embodiments. In the embodiments described below, the shared portions are indicated by the same reference numerals, and the overlapped description thereof is omitted.

One or more embodiments of the present invention will be described with reference to FIGS. 1 to 7. FIG. 1 illustrates an example of an image forming apparatus 100 of one or more embodiments. The image forming apparatus 100 of one or more embodiments is a digital multifunction apparatus called an MFP (MultiFunction Peripheral).

The image forming apparatus 100 includes sheet cassettes 101, an image forming unit 102, a sheet ejection unit 103, a document reading unit 104, and an operation panel 110.

The image forming unit 102 performs an image forming process that forms the image of a document read by the document reading unit 104 or the image of a document transmitted from the outside, on the front surface or the back surface of a sheet conveyed from each sheet cassette 101.

The sheet on which the image is formed by the image forming unit 102 is ejected from the sheet ejection unit 103.

The operation panel 110 is an operation unit that performs various settings associated with the image forming process, the instruction to start the image formation, and the like. The operation panel 110 includes a liquid crystal display panel displaying various operation buttons and the like, and a touch panel detecting touch on the panel surface. The liquid crystal display panel has a relatively large size of, for example, approximately 10 cm by 20 cm.

Also, the operation panel 110 of one or more embodiments includes a function of performing vibration by the panel itself as the response of operation. The detail of this function of performing vibration will be described later.

Figure 2:
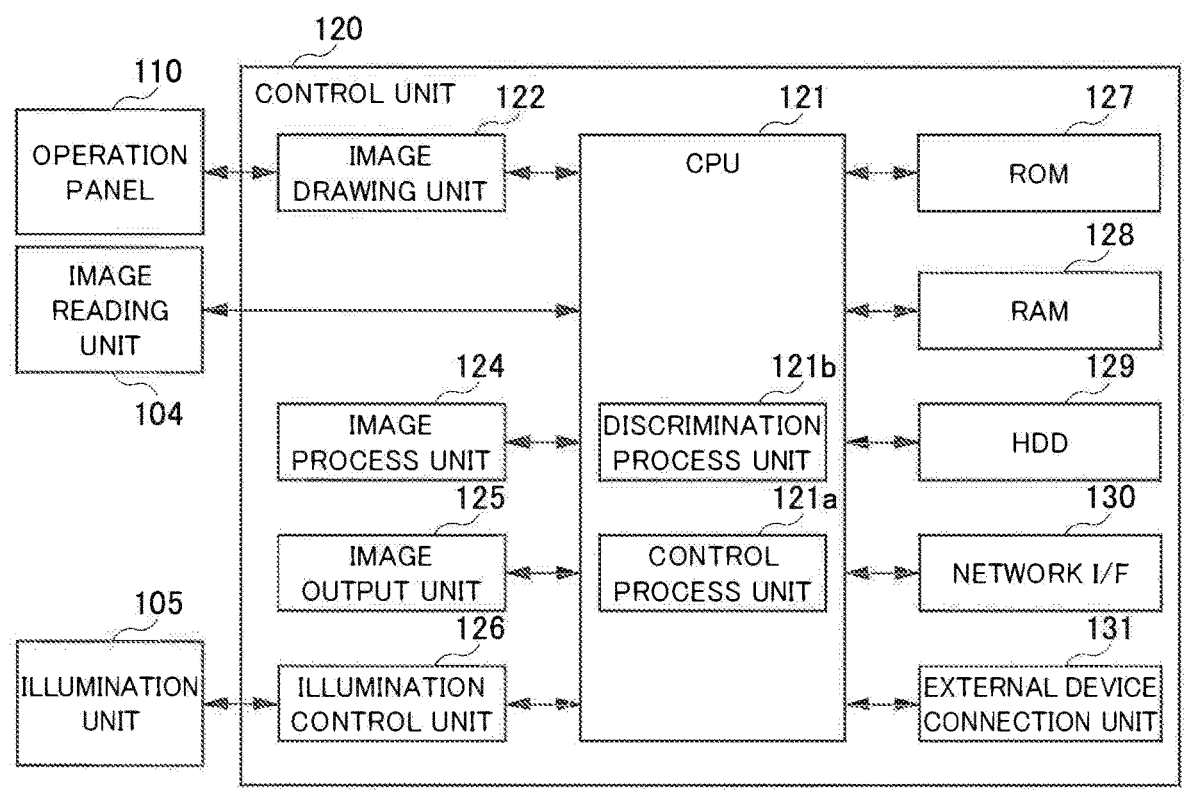
FIG. 2 is a block diagram illustrating an example of the control configuration of the apparatus according to one or more embodiments of the present invention.

FIG. 2 illustrates an example of the configuration of a control unit 120 of the image forming apparatus 100. The image forming process by the image forming apparatus 100 is executed under the control of the control unit 120 incorporated in the image forming apparatus 100.

The control unit 120 includes a central processing unit (hereinafter, called a "CPU") 121, an image drawing unit 122, an image process unit 124, an image output unit 125, and an illumination control unit 126. Also, the control unit 120 includes a ROM 127, a RAM 128, a hard disk drive (hereinafter, called an "HDD") 129, a network interface 130, and an external device connection unit (connector) 131.

The CPU 121 reads a program and data necessary for the control from the ROM 127, the RAM 128, or the HDD 129 connected thereto, and executes the control process for the image formation. By the execution of the read program, a control process unit 121a that executes a control process function is formed in the CPU 121. Also, by the execution of the read program, a discrimination process unit 121b that executes a discrimination function discriminating the state of each unit of the image forming apparatus 100 is formed in the CPU 121.

The ROM 127 and the RAM 128 are used for temporarily storing data, and the HDD 129 is mainly used for storing image data (document data).

The network interface 130 connected to the CPU 121 receives document data and the like from the outside. Also, the communication with a monitoring section that monitors the operation state of the image forming apparatus 100 is also performed via the network interface 130.

The CPU 121 performs the image forming process for the document read by the document reading unit 104 or the document received by the network interface 131. Here, the image process unit 124 is connected to the CPU 121, and executes a correction process and a working process of the image obtained from the document data. Then, the image data processed by the image process unit 124 is outputted from the image output unit 125, and the image formation is executed by the image forming unit 102 (FIG. 1).

Also, the image drawing unit 122 is connected to the CPU 121, and draws the image on the operation screen displayed on the operation panel 110 based on the instruction from the CPU 121. The operation panel 110 displays the operation screen on which the image is drawn by the image drawing unit 122.

Further, the illumination control unit 126 is connected to the CPU 121, and controls the illumination of the screen of the operation panel 110 based on the instruction from the CPU 121.

Also, the external device connection unit 131 is provided in the control unit 120, and can connect an external device, such as a card reader and a keyboard.

Figure 3:
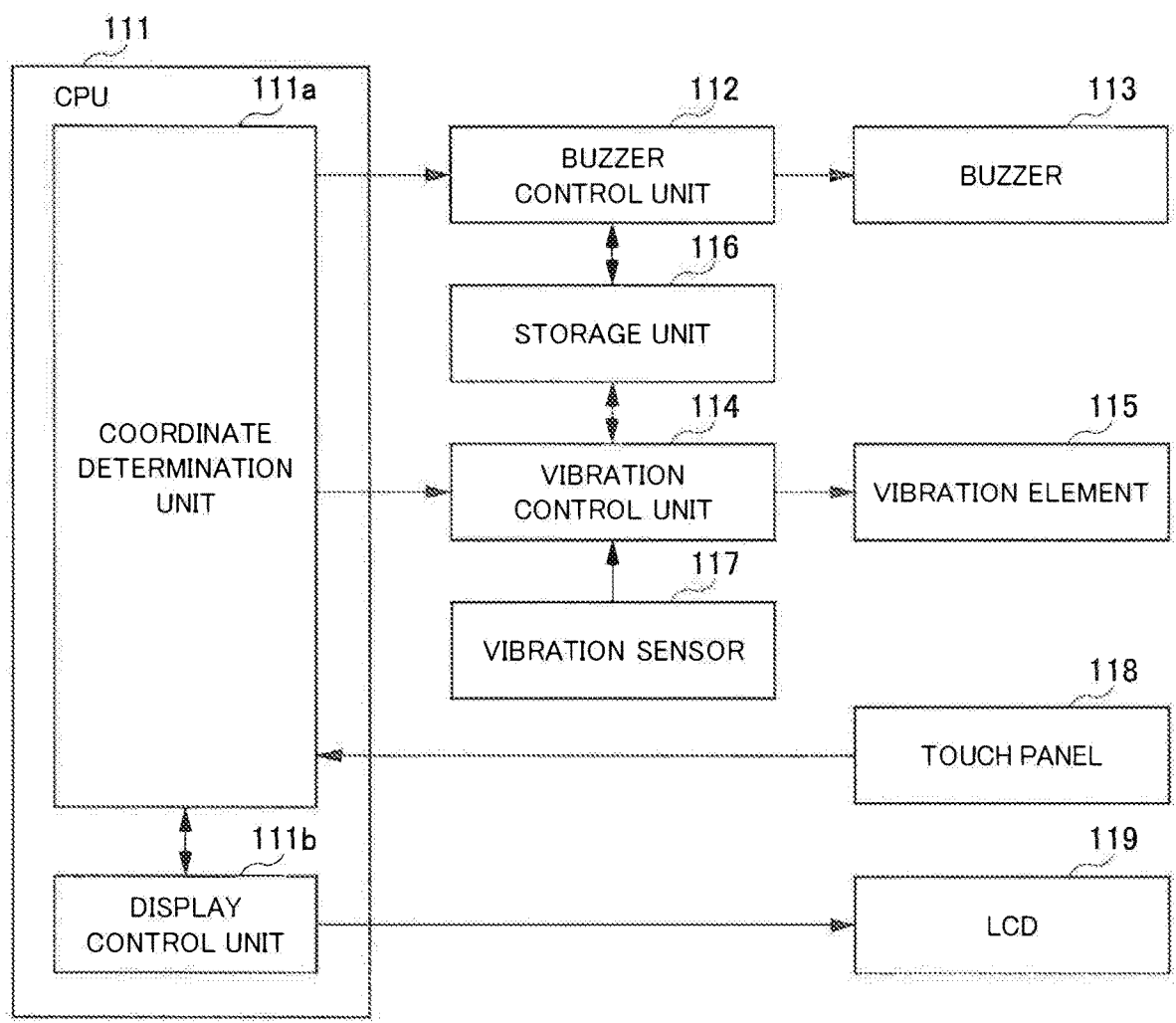
FIG. 3 is a block diagram illustrating an example of the configuration of an operation unit according to one or more embodiments of the present invention.

FIG. 3 illustrates the control configuration of the operation panel 110.

The operation panel 110 includes a CPU 111, a touch panel 118, and a liquid crystal display panel 119. The touch panel 118 detects touch on the front surface of the display screen of the liquid crystal display panel 119. The CPU 111 controls the touch detection on the touch panel 118 and the display on the liquid crystal display panel 119.

The CPU 111 includes a coordinate determination unit 111a that determines the touched coordinate position on the touch panel 118, and a display control unit 111b that controls the display of the liquid crystal display panel 119. The display control unit 111b controls the display on the liquid crystal display panel 119 based on the image data supplied from the image drawing unit 122 (FIG. 2) included in the control unit 120 of the image forming apparatus 100.

Also, the operation panel 110 includes a buzzer 113, a vibration element 115, and a vibration sensor 117.

The buzzer 113 performs the output of various sounds, such as an alarm sound, by the control of a buzzer control unit 112. The type, the sound volume correction, and the like of the sound outputted are set based on the data stored in a storage unit 116. The buzzer control unit 112 controls the output of the alarm sound and the like based on the instruction from the CPU 111.

The vibration element 115 vibrates the touch panel 118 and the liquid crystal display panel 119 by the control of a vibration control unit 114. The data, such as the type that vibrates the touch panel 118 and the liquid crystal display panel 119, and the vibration correction amount, is stored in the storage unit 116. Based on the instruction from the CPU 111, the vibration control unit 114 controls the vibration state while reading the data stored in the storage unit 116. The vibration sensor 117 detects the vibration state of the touch panel 118 and the liquid crystal display panel 119 by the vibration element 115. As the vibration sensor 117, for example, an element, such as an acceleration sensor, that can detect the vibration amount is used.

It should be noted that the vibration sensor 117 is not necessarily required to be provided. Also, in the configuration illustrated in FIG. 3, the CPU 111 and the vibration control unit 114 are separated, but the CPU 111 may include the function as the vibration control unit 114 to directly control the vibration element 115.

Next, a configuration that vibrates the touch panel 118 and the liquid crystal display panel 119 by the vibration element 115 will be described with reference to FIGS. 4 and 5.

Figure 4:
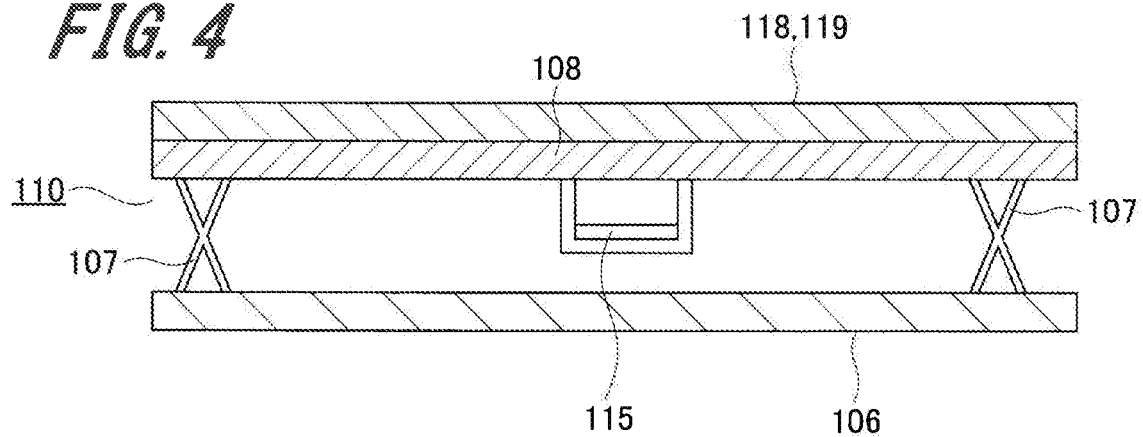
FIG. 4 is a cross-sectional view illustrating an example of an operation panel according to one or more embodiments of the present invention.

FIG. 4 is a cross-sectional view of the operation panel 110 mounted on the image forming apparatus 100.

The touch panel 118 and the liquid crystal display panel 119 of the operation panel 110 are disposed on an operation panel holding frame 108. This operation panel holding frame 108 is mounted over an operation panel mounting unit 106 of the housing of the image forming apparatus 100 via vibration absorption members (vibration absorbers) 107.

The vibration absorption members 107 each include a rubber, a spring, a damper, and the like, and are disposed on four corners and the like of the operation panel holding frame 108. Disposing the vibration absorption members 107 on the four corners is an example, and for example, the vibration absorption members 107 may be configured of rubber sheets and be disposed on the entire back surface side of the operation panel holding frame 108.

And, the vibration element 115 is mounted on the back surface side of the operation panel holding frame 108. The vibration element 115 vibrates the operation panel holding frame 108, the touch panel 118, and the liquid crystal display panel 119 in at least one direction by the application of a drive signal. As the vibration element 115, for example, a vibration motor in which a weight is mounted in the state of being eccentric to the rotation axis of the motor is used.

Here, since the operation panel holding frame 108 is mounted over the operation panel mounting unit 106 via the vibration absorption members 107, the vibration is not transmitted to the main body side of the image forming apparatus 100 other than the operation panel 110, and the operation panel 110 is efficiently vibrated in the state of being separated from the main body side.

Figure 5:
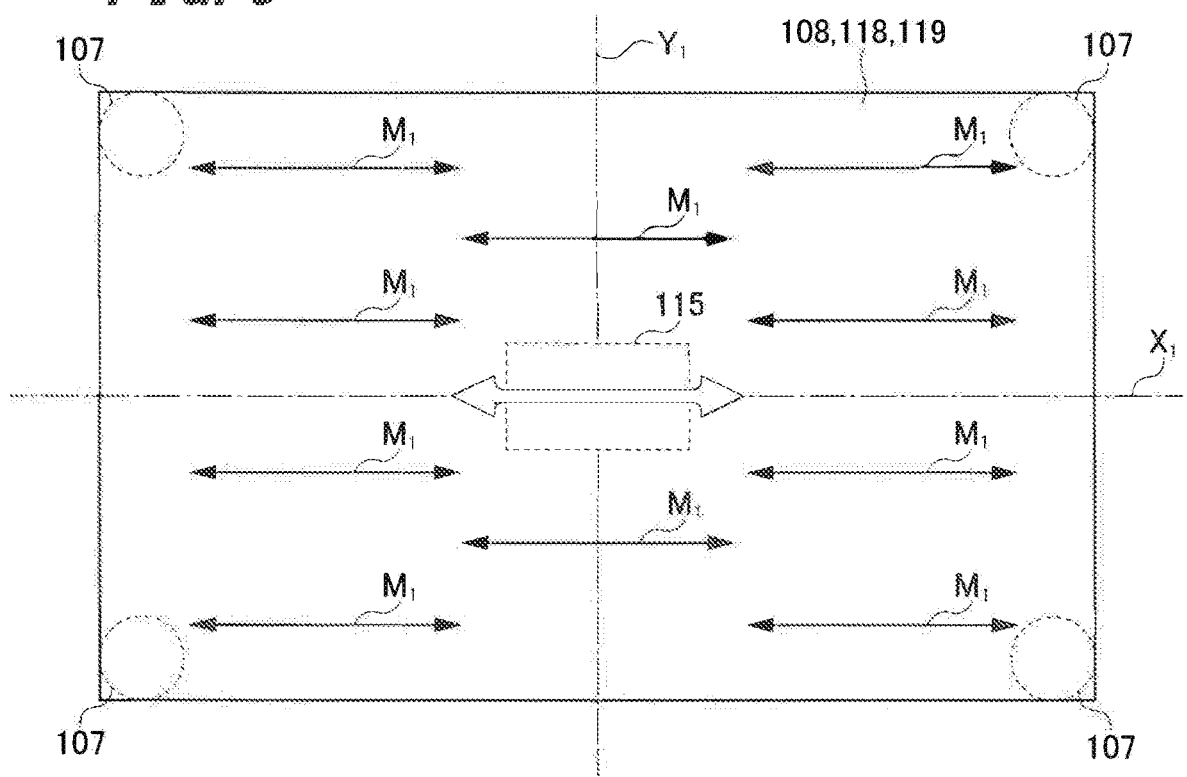
FIG. 5 is a top view illustrating an example of the operation panel (an example in which a vibration element is disposed at substantially the center on a gravity center axis) according to one or more embodiments of the present invention.

FIG. 5 is a diagram in which the mounting state of the vibration element 115 is seen from the front surface of the operation panel holding frame 108. The touch panel 118 and the liquid crystal display panel 119 are mounted on the operation panel holding frame 108, and the holding frame 108, the touch panel 118, and the liquid crystal display panel 119 become vibration members vibrated by the vibration element 115.

Here, the vibration element 115 is disposed such that many vibrations in the horizontal direction (in the left-right direction in FIG. 5) are produced. And, the vibration element 115 is mounted on the back surface of the operation panel holding frame 108 such that when a gravity center axis $X_1$ during the vibration of the vibration members (the frame 108, and the panels 118 and 119) in the horizontal direction is considered, the gravity center axis $X_1$ and the center of the vibration element 115 are substantially matched. In the example of FIG. 5, an example in which the vibration element 115 is disposed at substantially the center of the gravity center axis $X_1$ is illustrated.

As illustrated in FIG. 5, the vibration element 115 is disposed on the gravity center axis $X_1$, so that when the vibration element 115 produces vibrations transmitted in the horizontal direction (the left-right direction), vibrations $M_1$ at substantially the same vibration degree in all regions are produced on the touch panel 118 and the liquid crystal display panel 119 mounted on the operation panel holding frame 108. Each vibration $M_1$ indicated by the double-headed arrow in FIG. 5 indicates the moving width of each portion on the panel in the horizontal direction by the vibration element 115, and indicates the state where each portion on the panel is vibrated at substantially the same vibration degree.

When the vibration element 115 is disposed on the position shifted from the gravity center axis $X_1$, the uniform vibration in each portion on the panel as illustrated in FIG. 5 does not occur.

It should be noted that in the example of FIG. 5, the example in which the vibration element 115 is disposed at substantially the center of the gravity center axis $X_1$ is illustrated, but as long as the vibration element 115 is on the gravity center axis $X_1$, the vibration element 115 is not necessarily required to be at the center of the operation panel holding frame 108.

Figure 6:
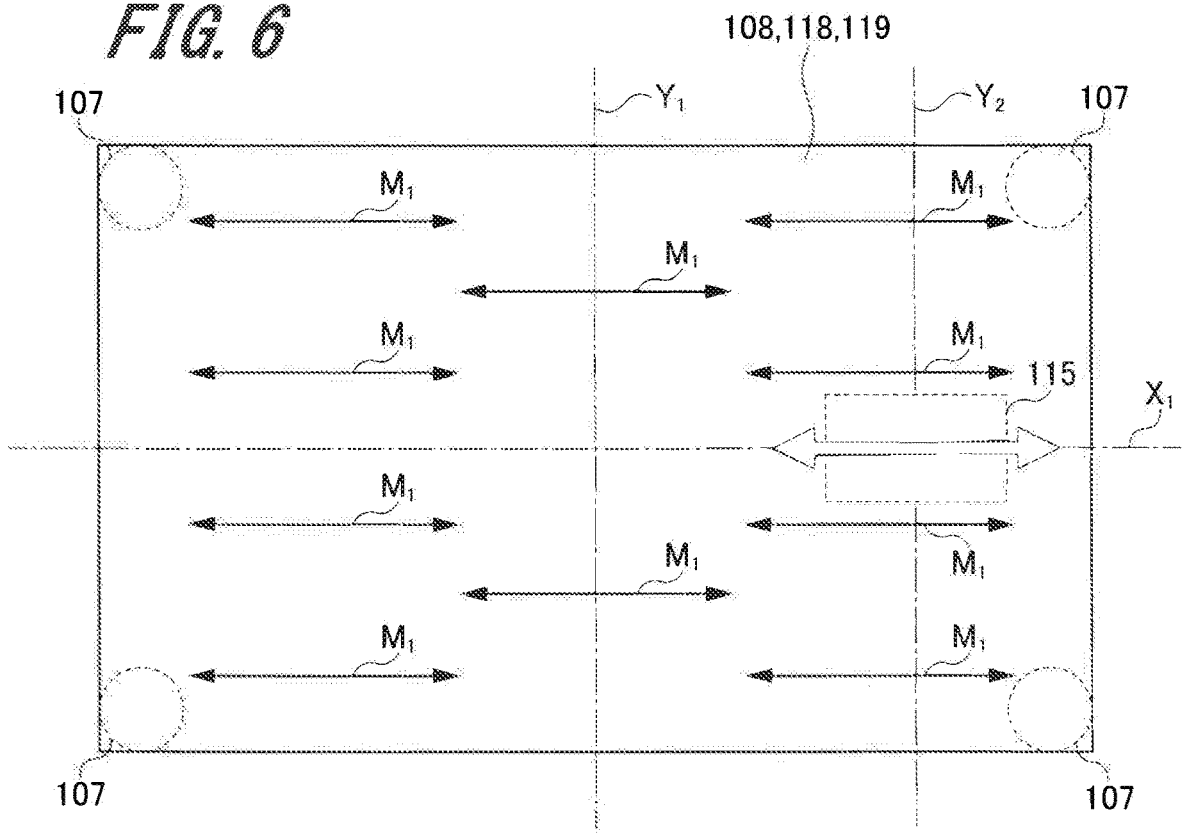
FIG. 6 is a top view illustrating another example of the operation panel (an example in which the vibration element is disposed on the position shifted from the center on the gravity center axis) according to one or more embodiments of the present invention.

For example, as illustrated in FIG. 6, even when the vibration element 115 is disposed on the position shifted to the right side of the gravity center axis $X_1$, each portion on the panel is vibrated at substantially the same vibration degree (vibration $M_1$) like the example in FIG. 5.

Figure 7:
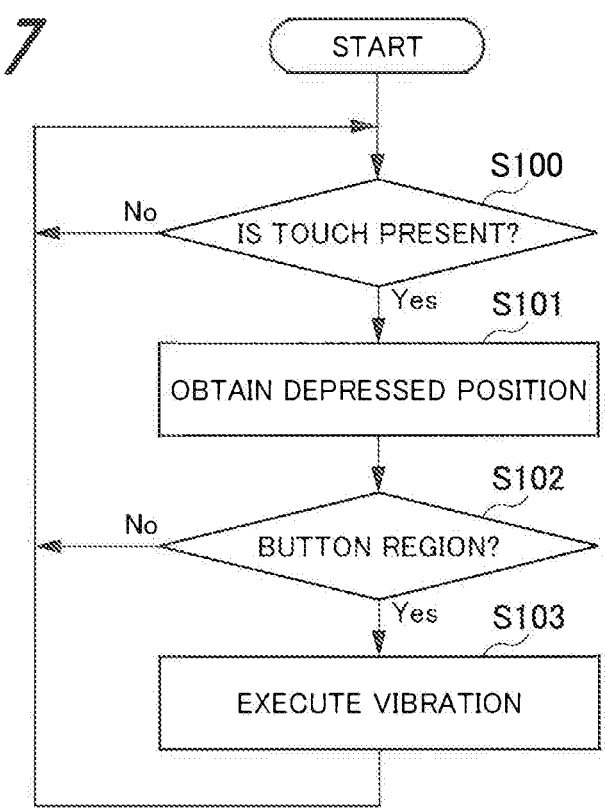
FIG. 7 is a flowchart illustrating an example of the control of a vibration control unit according to one or more embodiments of the present invention.

FIG. 7 is a flowchart illustrating an example of the process in which the CPU 111 of the operation panel 110 vibrates the vibration element 115.

First, the CPU 111 performs the touch detection of whether or not the touch panel 118 has been depressed (step S100). Here, for example, the CPU 111 detects the interruption signal from the touch panel 118, and determines that the depression is present.

Here, when the touch is absent (No in step S100), the process for vibrating the vibration element 115 is not executed at all, and this determination process is repeated until the presence of the touch is detected in step S100.

And, when the presence of the touch is detected in step S100 (Yes in step S100), the CPU 111 obtains the depressed position on the touch panel 118 (step S101). Further, it is determined whether or not the depressed position (touch position) obtained in step S101 is in the region of any one of the buttons displayed on the liquid crystal display panel 119 (step S102).

Here, when the button region has not been depressed (No in step S102), the CPU 111 returns to the determination in step S100, and repeatedly executes the same process when new depression is present.

Also, when the button region has been depressed in step S102 (Yes in step S102), the CPU 111 instructs the execution of the vibration process with respect to the vibration control unit 114 (step S103), returns to the determination in step S100, and repeatedly executes the same process when new depression is present.

The vibration control unit 114 that has received the instruction of the vibration process in step S103 vibrates the vibration element 115 for a short time. For example, the vibration control unit 114 vibrates the vibration element 115 only for a short time of approximately 20 ms to 100 ms.

By performing the vibration by the vibration element 115 for a short time, when the depression on the touch panel 118 immediately above the button displayed on the liquid crystal display panel 119 is present, the response of the depression is performed by the vibration.

It should be noted that the depression of the touch panel 118 may be one of the depression performed by the finger of a user who performs the operation and the depression by the previously prepared touch pen.

As described above, according to one or more embodiments, the vibration element 115 that vibrates the operation panel 110 is near on the gravity center axis in the vibration direction of the vibration element 115, so that the substantially uniform vibration can be given to each portion of the operation panel 110, and each portion of the operation panel 110 is vibrated at a substantially uniform strength.

That is, in the image forming apparatus 100 according to one or more embodiments, the operation panel 110 includes the touch panel 118, and when the touch panel 118 is touched by the finger and the like of the user, the response by the vibration of the touch panel 118 itself is performed. When the touch position is in the region other than the buttons displayed on the liquid crystal display panel 119, the response by the vibration is not performed, and only when the portion of the button is correctly touched, the presence of the touch is precisely notified by the vibration to the user who has operated the touch panel 118.

Then, as illustrated in FIGS. 5 and 6, even when any position on the panel is touched, the vibration state felt by the finger and the like that have touched the position is uniform, and the user who has operated the touch panel 118 can feel the vibration at a constantly appropriate strength.

Next, one or more embodiments of the present invention will be described with reference to FIG. 8. One or more embodiments described below are different from aforementioned embodiments in the mounting state of the vibration element 115 with respect to the operation panel 110 of the image forming apparatus 100. The configuration of the operation panel 110 other than the mounting configuration of the vibration element 115, the control that vibrates the vibration element 115, and the like are the same as the above-described embodiments.

Figure 8:
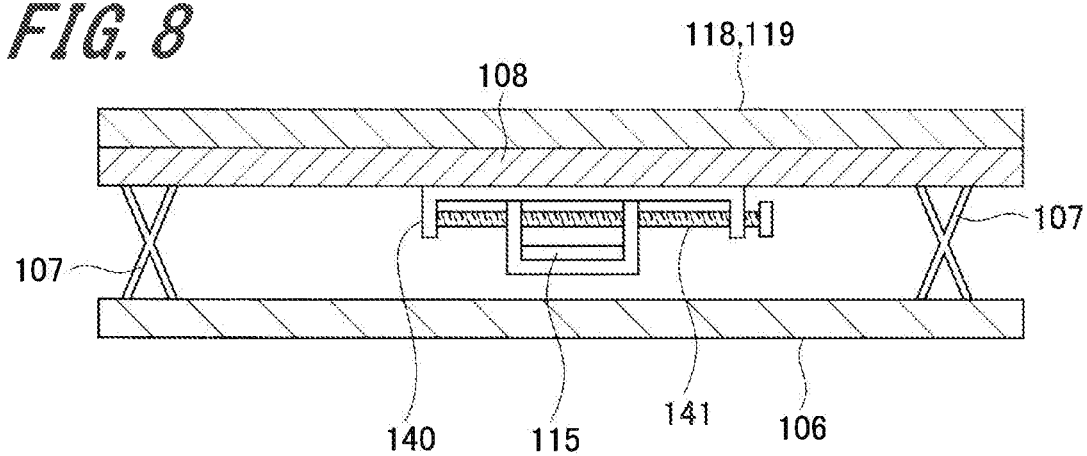
FIG. 8 is a cross-sectional view illustrating an example of the operation panel according to one or more embodiments of the present invention.

FIG. 8 is a cross-sectional view of the operation panel 110 of one or more embodiments.

In the operation panel 110 illustrated in FIG. 8, the touch panel 118 and the liquid crystal display panel 119 are disposed on the operation panel holding frame 108. Then, the vibration element 115 is mounted via a position adjusting unit (position adjuster) 140 below the operation panel holding frame 108 (the back side).

The position adjusting unit 140 changes the position of the vibration element 115 with respect to the operation panel holding frame 108 by turning an adjusting screw 141. The change in the position here is the change in the direction orthogonal to the gravity center axis $X_1$ during the vibration of the vibration members illustrated in FIG. 5 (the holding frame 108, the touch panel 118, and the liquid crystal display panel 119).

Therefore, by adjusting the position of the vibration element 115 by turning the adjusting screw 141, the mounting position of the vibration element 115 with respect to the vibration members can be adjusted to the position substantially overlapped with the gravity center axis $X_1$.

The operation of adjusting the position of the vibration element 115 by turning the adjusting screw 141 is performed, for example, during the assembling of the operation panel 110.

Specifically, the acceleration during the vibration on each position on the front surface of the touch panel 118 is measured by the acceleration sensor and the like, and when the variation in the vibration between the respective positions is great, the position of the vibration element 115 is slightly adjusted by the adjusting screw 141, thereby reducing the variation. As illustrated in FIGS. 5 and 6, the state where the variation is small corresponds to the state where the mounting position of the vibration element 115 is substantially overlapped with the gravity center axis $X_1$.

Since the mounting position of the vibration element 115 can be adjusted in this way, even when there is the variation of the member, such as the vibration element 115, the vibration element 115 can be easily adjusted into the proper state.

It should be noted that the configuration of the position adjusting unit 140 illustrated in FIG. 8 illustrates an example, and the mounting position of the vibration element 115 may be adjustable by other configuration.

In addition, in the example illustrated in FIG. 8, the adjusting operator turns the adjusting screw 141 to adjust the mounting position of the vibration element 115, but the mounting position of the vibration element 115 may be adjustable by the driving by an actuator of some kind. For example, a motor that rotationally drives the adjusting screw 141 illustrated in FIG. 8 may be mounted to adjust the mounting position of the vibration element 115 by the rotation driving by the motor.

In this case, by an adjusting device that determines the result obtained by measuring the acceleration during the vibration on each position on the front surface of the touch panel 118 by the acceleration sensor and the like, the driving of the actuator that adjusts the mounting position of the vibration element 115 may be automatically adjusted.

Next, one or more embodiments of the present invention will be described with reference to FIGS. 9 and 10.

In the above-described embodiments, the mounting position of the vibration element 115 is adjusted by the position adjusting unit 140, but one or more embodiments described below are different from the above-described embodiments in that a gravity center position adjusting unit different from the vibration element 115 is provided. The configuration of the operation panel 110 other than the gravity center position adjusting unit, the control that vibrates the vibration element 115, and the like are the same as the above-described embodiments.

Figure 9:
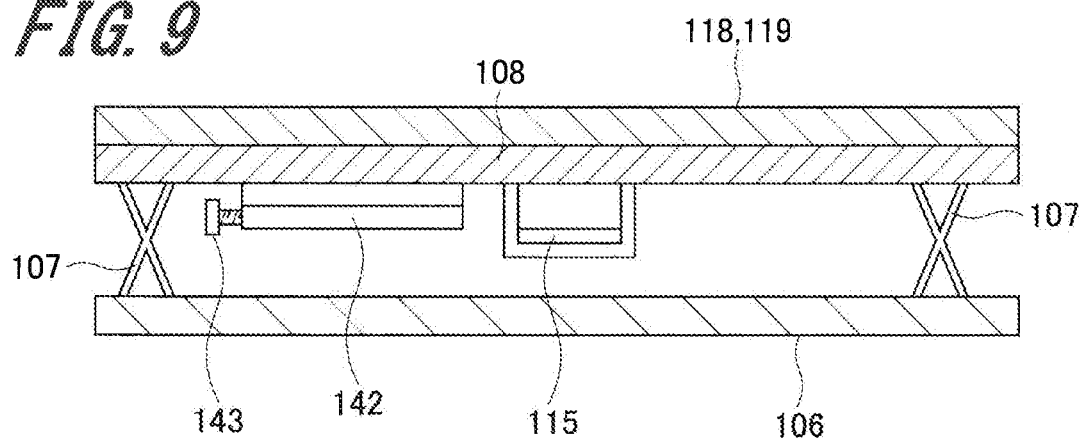
FIG. 9 is a cross-sectional view illustrating an example of the operation panel according to one or more embodiments of the present invention.
Figure 10:
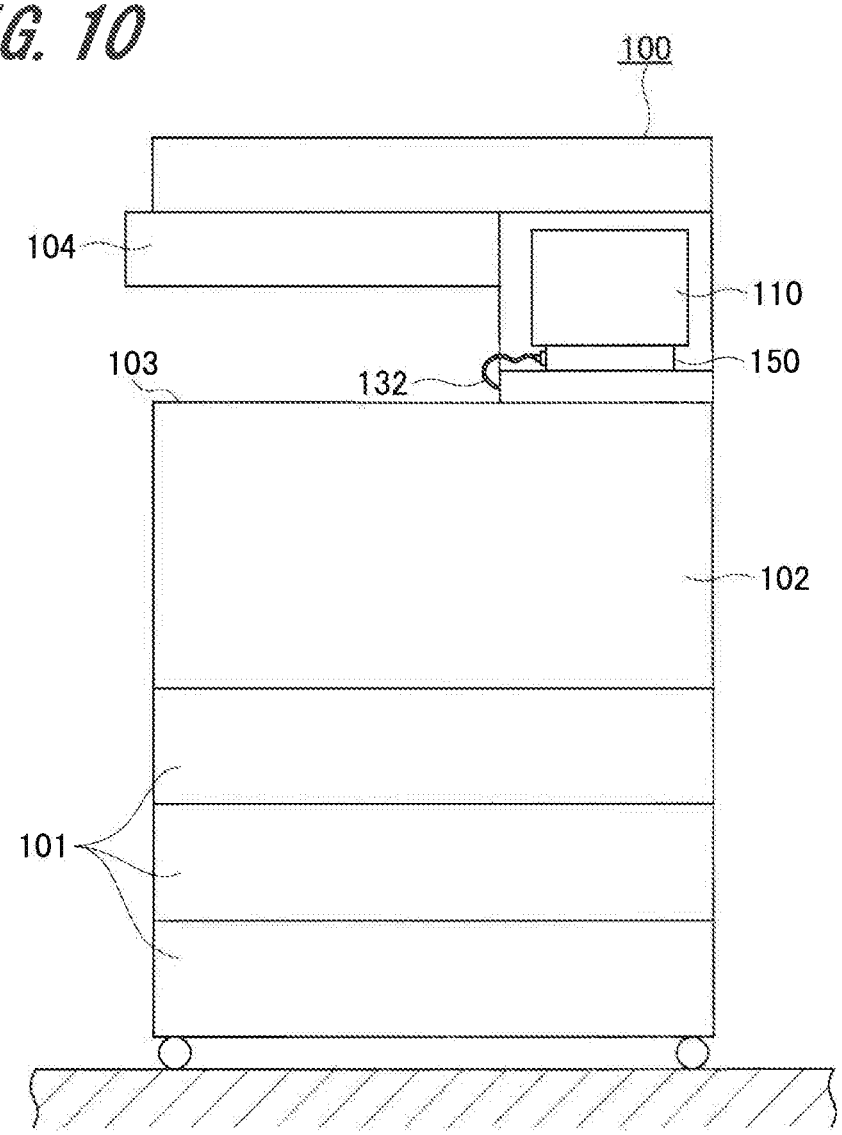
FIG. 10 is a block diagram illustrating an example in which the adjustment of a gravity center position is necessary according to one or more embodiments of the present invention.

FIG. 9 is a cross-sectional view of the operation panel 110 of one or more embodiments.

In the operation panel 110 illustrated in FIG. 9, the touch panel 118 and the liquid crystal display panel 119 are disposed on the operation panel holding frame 108. Then, the vibration element 115 is directly mounted below the operation panel holding frame 108 (the back side), and a gravity center position adjusting unit (gravity center adjuster) 142 is mounted on the position different from the position of the vibration element 115.

In the gravity center position adjusting unit 142, the position of the gravity center position adjusting unit 142 with respect to the operation panel holding frame 108 is changed by turning an adjusting screw 143. The changing direction of the position here is the direction orthogonal to the gravity center axis $X_1$ during the vibration of the vibration members illustrated in FIG. 5 (the holding frame 108, the touch panel 118, and the liquid crystal display panel 119).

Therefore, by adjusting the position of the gravity center position adjusting unit 142 by turning the adjusting screw 143, the gravity center position of the vibration element 115 with respect to the vibration members can be adjusted to the position substantially overlapped with the gravity center axis $X_1$.

The operation of adjusting the gravity center position by turning the adjusting screw 143 is performed, for example, during the assembling of the operation panel 110. This adjusting operation can be performed like the adjustment by the position adjusting unit 140 according to the above-described embodiments. That is, the acceleration during the vibration on each position on the front surface of the touch panel 118 is measured by the acceleration sensor and the like, and when the variation in the vibration between the respective positions is great, the gravity center position is slightly adjusted by the adjusting screw 143, thereby reducing the variation.

By adjusting the gravity center position by the gravity center position adjusting unit 142 in this way, the vibration element 115 can be easily adjusted into the proper gravity center state.

It should be noted that also in the case of the example illustrated in FIG. 9, like the example illustrated in FIG. 8, the adjustment by the gravity center position adjusting unit 142 may be enabled by the driving by the actuator, such as the motor, and further, the mounting position of the vibration element 115 may be automatically adjustable by using the adjusting device.

Next, an example in which the adjustment using the gravity center position adjusting unit 142 described in one or more embodiments of the present invention is necessary according to the use form of the image forming apparatus 100 will be described with reference to FIGS. 10 and 11.

Various option devices can be additionally mounted on the operation panel 110 of the image forming apparatus 100.

That is, the option devices, such as a keyboard for inputting letters and numbers, a card reader for card identification, a sensor for various identifications, such as biological identification can be additionally mounted on the operation panel 110 of the image forming apparatus 100.

In the example illustrated in FIG. 10, an example in which an external device (extension operation device) 150 that is the keyboard is additionally mounted below the operation panel 110 of the image forming apparatus 100 is illustrated. The external device 150 is connected by for example, the external device connection unit 131 (FIG. 2) and a cable 132.

Figure 11:
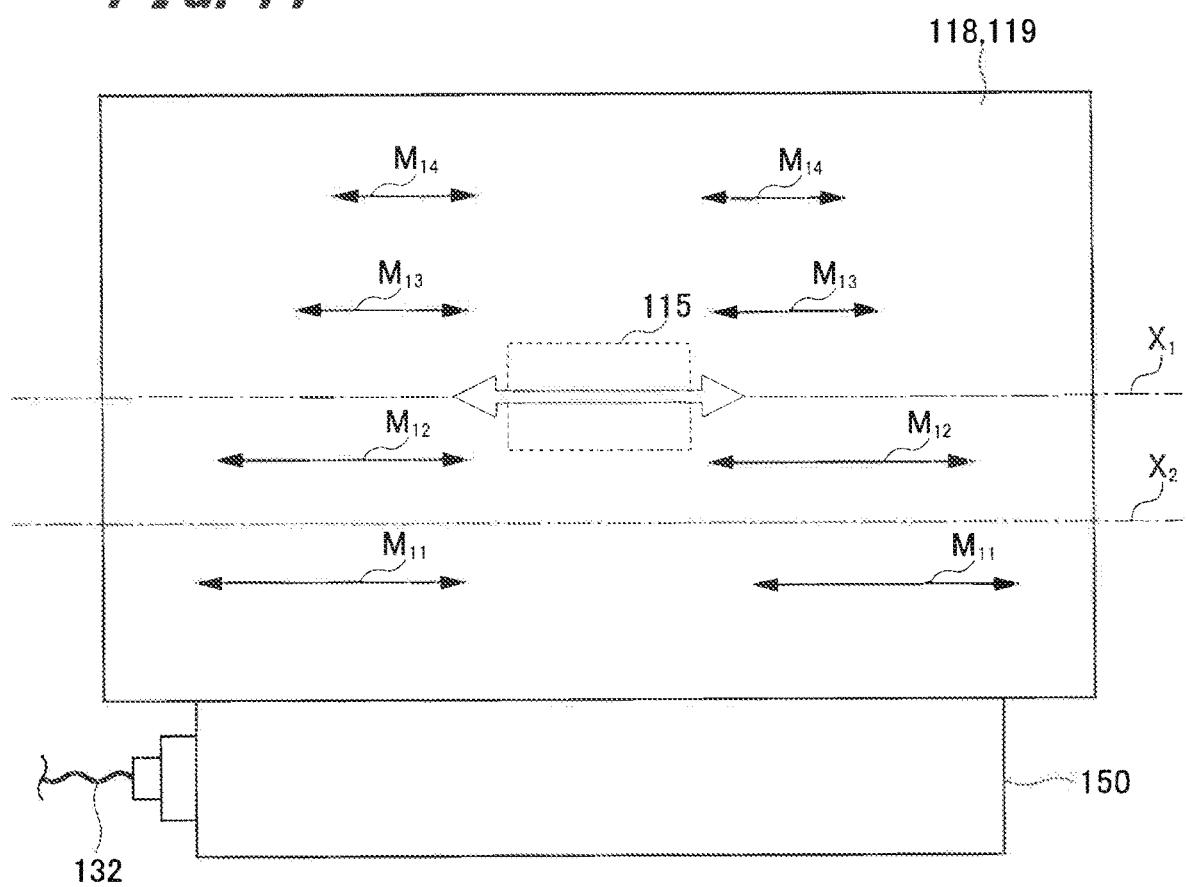
FIG. 11 is a top view illustrating an example of the operation panel when the adjustment of the gravity center position is necessary according to one or more embodiments of the present invention.

FIG. 11 illustrates the detail of the case where the external device 150 is mounted below the operation panel 110.

As illustrated in FIG. 11, by mounting the external device 150 below the operation panel 110, when the operation panel 110 is vibrated by the vibration element 115, the external device 150 is also vibrated.

Here, even when the vibration element 115 is mounted on the gravity center axis $X_1$ of the vibration members before the external device 150 is mounted, the additional mounting of the external device 150 changes the gravity center position according to the weight of the external device 150 itself. That is, as illustrated in FIG. 11, the gravity center position is changed from the gravity center axis $X_1$ to a gravity center axis $X_2$. In the state where the gravity center position is changed to the gravity center axis $X_2$, the vibration states of the respective portions vibrated by the vibration element 115 are changed on the respective positions on the panel, like vibrations $M_{11}$ to $M_{14}$ illustrated in FIG. 11.

In such a case, the previously described gravity center position adjusting unit 142 illustrated in FIG. 9 is previously prepared, and the gravity center position is adjusted by turning the adjusting screw 143, so that even in the state where the external device 150 is mounted, the vibration element 115 can be returned to the gravity center axis $X_1$ that is the original position.

The gravity center positions of the vibration members are returned to the gravity center axis $X_1$, and the vibration element 115 is disposed on the gravity center axis $X_1$, so that from the principle illustrated in FIGS. 5 and 6, the vibration states of the respective portions become uniform.

It should be noted that although the example in which the gravity center is corrected by using the gravity center position adjusting unit 142 illustrated in FIG. 9 has been described here, when the external device 150 is connected, the position of the vibration element 115 may be adjusted by using the position adjusting unit 140 illustrated in FIG. 8 so as to be on the new gravity center position.

Next, one or more embodiments of the present invention will be described with reference to FIGS. 12 and 13.

In one or more embodiments, as illustrated in FIG. 11 illustrated above, another solving example in which the external device (option device) 150 is mounted on the operation panel 110 of the image forming apparatus 100, and the gravity center axis of the operation panel 110 is changed from the gravity center axis $X_1$ before the mounting to the gravity center axis $X_2$ after the mounting is illustrated.

Figure 12:
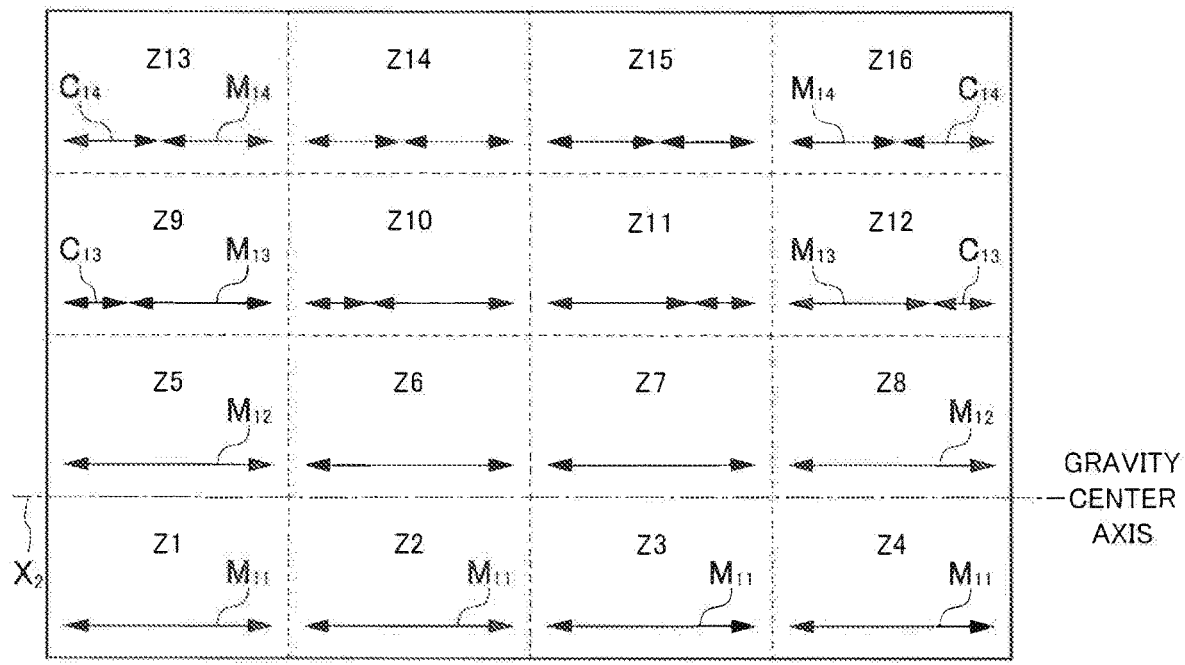
FIG. 12 is a diagram illustrating an example of the configuration of regions on the operation surface of the operation panel and the correction amount in each region according to one or more embodiments of the present invention.

That is, as illustrated in FIG. 12, it is assumed that the vibration members of the operation panel 110 are disposed on the gravity center axis $X_2$ shifted from the center to the lower side by the mounting of the external device 150.

Here, as illustrated in FIG. 12, when the panel surface of the operation panel 110 is divided into a plurality of regions (here, regions Z1 to Z16 of a 4 by 4 matrix), in the regions Z1 to Z8 near the gravity center axis $X_2$, the vibrations $M_{11}$ and $M_{12}$ in which the vibration amount by the vibration element 115 is relatively large are obtained.

On the contrary, in the regions Z9 to Z16 on the upper side of the panel away from the gravity center axis $X_2$, the movements in the direction different from the vibration direction are produced, and as a result, the vibrations $M_{13}$ and $M_{14}$ less than the vibrations $M_{11}$ and $M_{12}$ are obtained.

Here, when the panel in the regions Z9 to Z16 is touched, as illustrated in FIG. 12, correction amounts $C_{13}$ and $C_{14}$ that respectively correct the vibrations $M_{13}$ and $M_{14}$ are added to the drive signals to vibrate the vibration element 115. Specifically, when detecting the touch in the regions Z9 to Z12 illustrated in FIG. 12, the CPU 111 (FIG. 3) vibrates the vibration element 115 by the drive signal to which the correction amount $C_{13}$ that corrects the vibration $M_{13}$ is added. Also, when detecting the touch in the regions Z13 to Z16 illustrated in FIG. 12, the CPU 111 vibrates the vibration element 115 by the drive signal to which the correction amount $C_{14}$ that corrects the vibration $M_{14}$ is added. By performing these corrections, even when any of the regions Z1 to Z16 is touched, the uniform vibration can be achieved.

Figure 13:
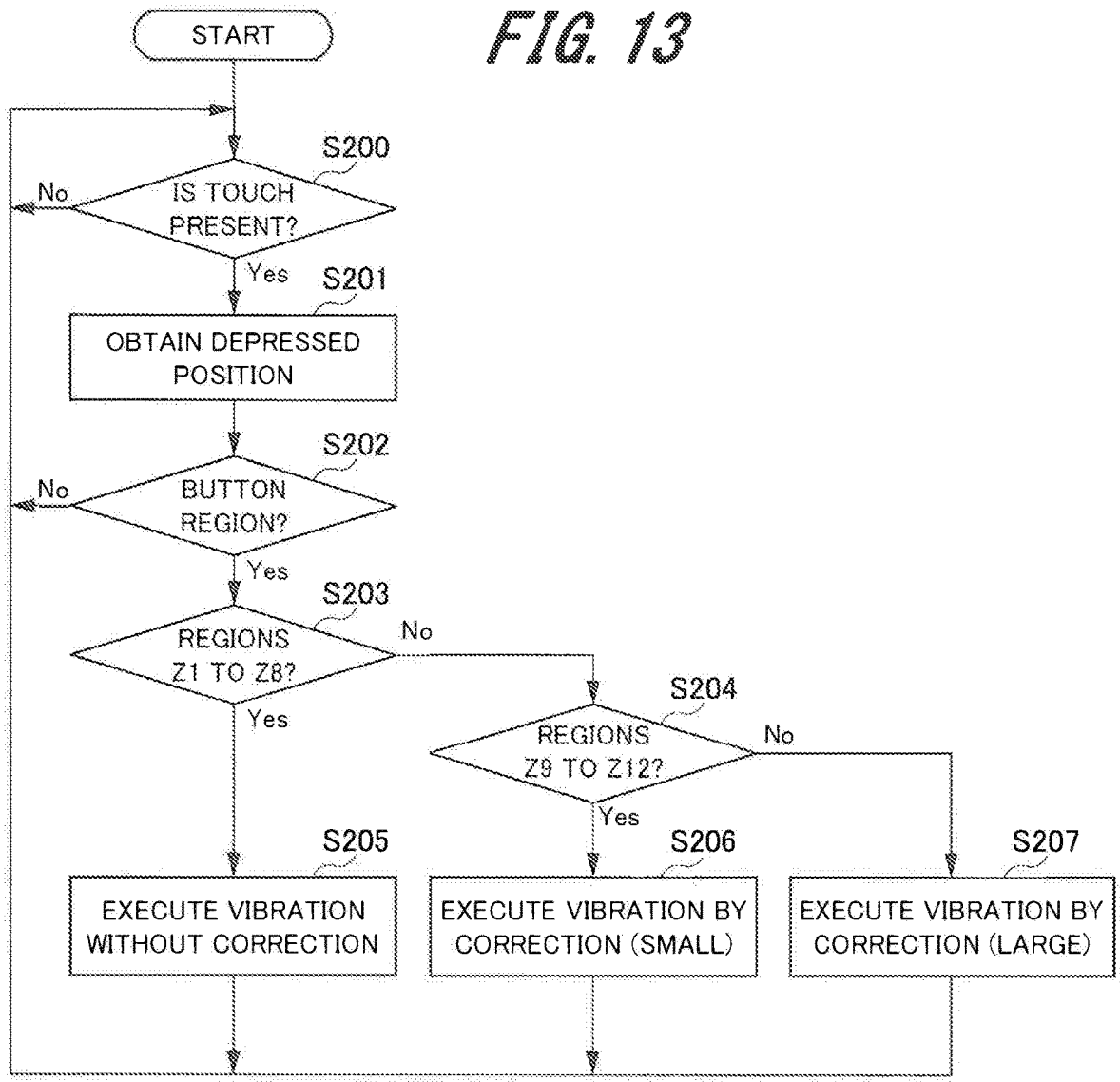
FIG. 13 is a flowchart illustrating an example of the control of the vibration control unit according to one or more embodiments of the present invention.

FIG. 13 is a flowchart illustrating an example of the control process of the vibration element 115 performed by the CPU 111. For example, the process of the flowchart illustrated in FIG. 13 is executed by the CPU 111 when the control unit 120 (FIG. 2) detects that the external device has been connected to the external device connection unit 131.

First, the CPU 111 performs the touch detection of whether or not the touch panel 118 has been depressed (step S200). Here, for example, the CPU 111 detects the interruption signal from the touch panel 118, and determines that the depression is present.

Here, when the touch is absent (No in step S200), the process for vibrating the vibration element 115 is not executed at all, and this determination process is repeated until the presence of the touch is detected in step S200.

And, when the presence of the touch is detected in step S200 (Yes in step S200), the CPU 111 obtains the depressed position on the touch panel 118 (step S201). Further, it is determined whether or not the depressed position (the touch position) obtained in step S201 is in the region of any one of the buttons displayed on the liquid crystal display panel 119 (step S202).

Here, when the button region has not been depressed (No in step S202), the CPU 111 returns to the determination in step S200, and repeatedly executes the same process when new depression is present.

The process until here is the same control process as the flowchart in FIG. 7, but in one or more embodiments, the process after step S203 is further performed. That is, when it is determined in step S202 that the button region has been depressed (Yes in step S202), the CPU 111 determines whether or not the touched region is any one of the regions Z1 to Z8 (step S203).

Here, when the touched region is any one of the regions Z1 to Z8 (Yes in step S203), the CPU 111 instructs the execution of the vibration process without correction with respect to the vibration control unit 114 (step S205). After executing the vibration process, the CPU 111 returns to the determination in step S200, and repeatedly executes the same process when new depression is present.

Also, when in step S203, the touched region is not any one of the regions Z1 to Z8 (No in step S203), the CPU 111 determines whether or not the touched region is any one of the regions Z9 to Z12 (step S204).

Here, when the touched region is any one of the regions Z9 to Z12 (Yes in step S204), the CPU 111 instructs the execution of the vibration process with respect to the vibration control unit 114 in the state of adding the correction by a small correction amount (the correction by the correction amount $C_{13}$ illustrated in FIG. 12) (step S206). After the vibration process is executed, the CPU 111 returns to the determination in step S200, and repeatedly executes the same process when new depression is present.

Further, when in step S204, the touched region is not any one of the regions Z9 to Z12 (No in step S204), the CPU 111 determines that any one of the regions Z13 to Z16 has been touched. At this time, the CPU 111 instructs the execution of the vibration process with respect to the vibration control unit 114 in the state of adding the correction by a large correction amount (the correction by the correction amount $C_{14}$ illustrated in FIG. 12) (step S207). After the vibration process is executed, the CPU 111 returns to the determination in step S200.

As described above, even when the external device (the option device) 150 is mounted on the operation panel 110, the vibration state of the operation panel 110 by the vibration element 115 can be corrected into the uniform state.

Next, one or more embodiments of the present invention will be described with reference to FIG. 14. The previously described configuration in FIG. 3, includes, as the operation panel 110, the vibration sensor 117 that detects the vibration by the vibration element 115. In one or more embodiments, at the time of detecting the change in the vibration amount due to the change with time and the like from the vibration state detected by the vibration sensor 117, the change amount is corrected.

Figure 14:
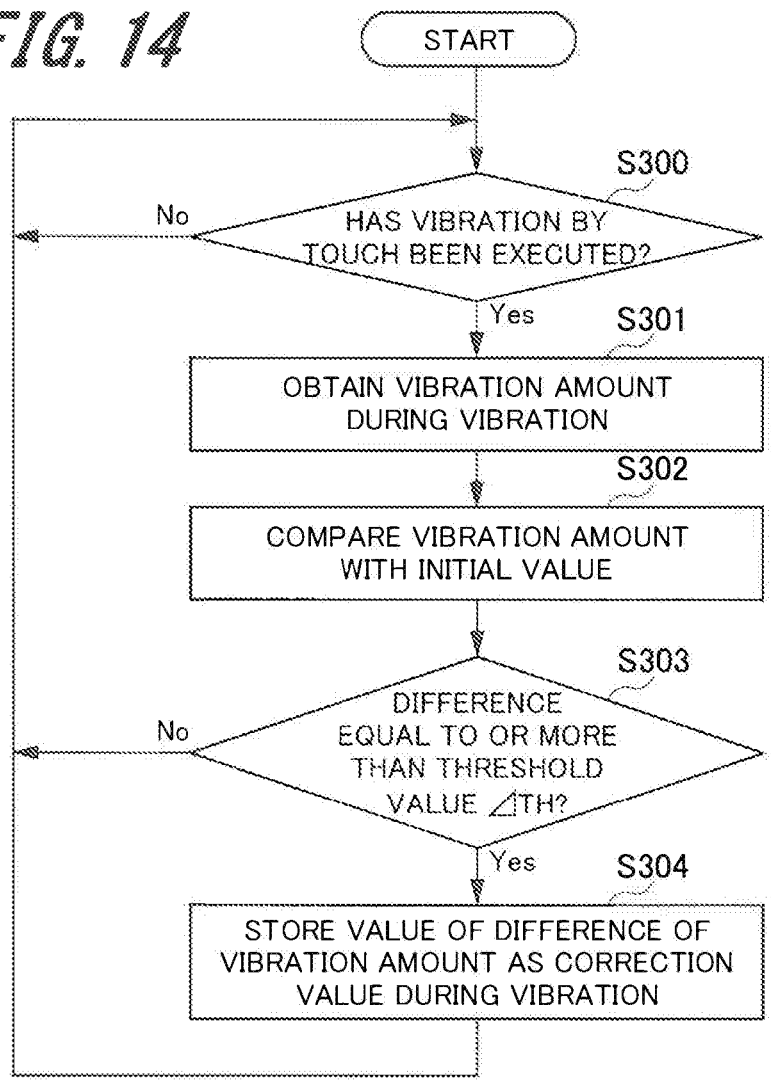
FIG. 14 is a flowchart illustrating an example of the control of the vibration control unit according to one or more embodiments of the present invention.

FIG. 14 is a flowchart illustrating the process performed by the CPU 111 (FIG. 3) in one or more embodiments.

First, the CPU 111 determines whether or not the vibration of the vibration element 115 by touch has been executed (step S300). Here, when the execution of the vibration is absent (No in step S300), the CPU 111 returns to the determination in step S300, and is standby until the vibration is present.

Then, in step S300, when the vibration of the vibration element 115 by touch is present, the CPU 111 obtains the vibration amount during the vibration from the vibration sensor 117 (step S301). Thereafter, the CPU 111 compares the obtained vibration amount with the vibration amount of the previously stored initial value (step S302), and determines whether or not the difference between the obtained vibration amount and the initial value is equal to or more than a previously set threshold value $\Delta TH$ (step S303).

Here, when the difference is not equal to or more than the threshold value $\Delta TH$ (No in step S303), the CPU 111 returns to the determination in step S300, and is standby until the vibration is present.

Then, in step S300, when the difference is equal to or more than the threshold value $\Delta TH$ (Yes in step S303), the CPU 111 stores the value of the detected difference in the storage unit 116 (FIG. 3) as the correction value during the vibration, and returns to the determination in step S300 (step S304). Here, when the correction value is stored in the storage unit 116, the CPU 111 (or the vibration control unit 114) adds the stored correction value to the drive signal of the vibration element 115 during the next vibration and thereafter.

By configuring the image forming apparatus 100 in this way, when the vibration state of the operation panel 110 due to the change with time by the use of the image forming apparatus 100 and the like is changed, the change is automatically corrected.

Modification

It should be noted that in the embodiments described above, when the external device 150, such as the previously prepared keyboard, is connected to the operation panel 110, the correction is automatically made, but in the actual use environment, a device other than the genuine device is sometimes mounted on the operation panel 110. In such a case, aside from the previously prepared correction value of the option device, the user may perform setting so as to select, from the correction values in a plurality of stages, the correction value that is considered optimum, thereby correcting the vibration operation.

However, when the uniformity of the vibration is difficult to be recognized by the tactile sense of a person, the vibration sensor 117 disposed in the operation panel 110 may be allowed to detect the detailed vibration amount for each region to automatically obtain the correction value.

Also, in the embodiments described above, the case where the vibration element 115 is vibrated mainly in the horizontal direction of the operation panel 110 has been described, but also in the case where the vibration element 115 is vibrated in another direction, the same process may be performed to make the vibration state uniform.

Also, in the embodiments described above, the example in which the operation panel included in the image forming apparatus that is a stationary apparatus is vibrated has been illustrated, but also in the case where the operation panel that is the input device of each of other various stationary apparatuses is vibrated, the same configuration and the same control process may be applied.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

REFERENCE SIGNS LIST

100 . . . image forming apparatus, 101 . . . sheet cassette, 102 . . . image forming unit, 103 . . . sheet ejection unit, 104 . . . document reading unit, 105 . . . illumination unit, 106 . . . operation panel mounting unit, 107 . . . vibration absorption member (vibration absorber), 108 . . . operation panel holding frame, 110 . . . operation panel, 111 . . . central processing unit (CPU), 114 . . . vibration control unit, 115 . . . vibration element, 117 . . . vibration sensor, 118 . . . touch panel, 119 . . . liquid crystal display panel, 120 . . . control unit, 121 . . . central processing unit (CPU), 131 . . . external device connection unit (connector), 132 . . . cable, 140 . . . position adjusting unit (position adjuster), 141 . . . adjusting screw, 142 . . . gravity center position adjusting unit (gravity center adjuster), 143 . . . adjusting screw, 150 . . . external device, $X_1$ . . . gravity center axis

What is claimed is:

1. An input device comprising:
an operation panel that receives an operation input;
a vibration element that is mounted to the operation panel and that vibrates one or more regions of the operation panel in at least one vibration direction;
a vibration absorber that connects the operation panel to an apparatus main body and that absorbs a vibration of the operation panel; and
a CPU that causes the vibration element to vibrate based on the operation input, wherein the vibration element is mounted on a gravity center axis of the operation panel in the vibration direction such that the respective regions of the operation panel uniformly vibrate, and
the operation panel comprises a gravity center adjuster that, once a gravity center position of the vibration element changes, moves the gravity center position to a position overlapping the gravity center axis by a user operation.

2. The input device according to claim 1, wherein
the operation panel comprises a connector that connects an extension operation device to the operation panel, and
when the extension operation device is connected to the connector, the CPU corrects a vibration amount at the time when the vibration element vibrates the operation panel.

3. The input device according to claim 1, wherein the CPU further:
sets, for each of the divided regions, a correction value that corrects a vibration amount at the time when the vibration element vibrates the operation panel, and corrects the vibration amount by the correction value set to a region, among the divided regions, that receives the operation input.

4. The input device according to claim 1, further comprising:
a vibration sensor that detects a vibration amount at the time when the vibration element vibrates the operation panel,
wherein when the detected vibration amount changes, the CPU corrects the vibration amount based on the detected vibration amount.

5. An image forming apparatus that performs an image forming process on a printing medium, the image forming apparatus comprising:
an operation panel that receives an operation input associated with the image forming process;
a vibration element that is mounted to the operation panel and vibrates one or more portions of the operation panel in at least one vibration direction;
a vibration absorber that connects the operation panel to an apparatus main body and absorbs the vibration of the operation panel; and
a CPU that causes the vibration element to vibrate based on the operation input on the operation panel, wherein
the vibration element is disposed on a gravity center axis of the operation panel in the vibration direction such that the respective portions of the operation panel uniformly vibrate, and
the operation panel comprises a gravity center adjuster that, once a gravity center position of the vibration element changes, moves the gravity center position to a position overlapping the gravity center axis by a user operation.

* * * * *